United States Patent
Bunch et al.

[11] Patent Number: 5,359,257
[45] Date of Patent: Oct. 25, 1994

[54] BALLISTIC ELECTRON, SOLID STATE CATHODE

[76] Inventors: Kyle J. Bunch, 391 E. Woodlake Dr., Murray, Utah 84107; William N. Cain, 138 P St., #1, Salt Lake City, Utah 84103; Richard W. Grow, 4311 S. Spruce Cir., Holladay, Utah 84117

[21] Appl. No.: 621,636
[22] Filed: Dec. 3, 1990
[51] Int. Cl.$^5$ .................................... H01L 29/161
[52] U.S. Cl. .................... 313/310; 313/446; 257/10; 257/11; 257/12
[58] Field of Search .............. 313/346 R, 311, 310, 313/446; 357/16; 257/10, 11, 12, 26

[56] References Cited

U.S. PATENT DOCUMENTS

| | | | |
|---|---|---|---|
| 2,960,659 | 11/1960 | Burton | 313/346 R X |
| 3,334,248 | 8/1967 | Stratton | 257/10 X |
| 4,352,117 | 9/1982 | Cuomo et al. | 357/30 |
| 4,506,284 | 3/1985 | Shannon | 257/10 X |
| 4,574,216 | 3/1986 | Hoeberechts et al. | 313/446 X |
| 4,717,855 | 1/1988 | Zwier et al. | 313/446 X |
| 4,833,517 | 5/1989 | Heiblum et al. | 357/16 X |
| 4,853,754 | 8/1989 | Van Gorkom et al. | 357/16 |
| 4,929,997 | 5/1990 | Honjo et al. | 357/16 X |
| 4,985,737 | 1/1991 | Gaylord et al. | 357/16 X |
| 5,031,015 | 7/1991 | Miyawaki | 357/16 |

OTHER PUBLICATIONS

M. Heiblum and L. F. Eastman, "Ballistic Electrons in Semiconductors," *Scientific American*, Feb. 1987, pp. 102-111.

Primary Examiner—Donald J. Yusko
Assistant Examiner—Ashok Patel
Attorney, Agent, or Firm—Trask, Britt & Rossa

[57] ABSTRACT

A majority carrier, solid state cathode uses ballistic behavior to provide a highly coherent (and modulated) electron beam, with a large current density and expected efficiencies greater than fifty percent.

55 Claims, 16 Drawing Sheets

BALLISTIC ELECTRON, SOLID STATE CATHODE

BACKGROUND OF THE INVENTION

1. Field

This invention relates to solid state devices utilizing ballistic electron behavior. It is specifically directed to solid state nonthermionic cathodes.

2. State of the Art

Cathodes are conventionally thermionic in nature. Thermionic cathodes are widely used, and have been the only practical devices available for most applications requiring an electron beam. The design of practical electronic devices has thus been constrained by the power requirements and other limitations inherent in thermionic cathodes.

A great need exists for nonthermionic cathodes with long lifetimes, high current densities, and with the ability for instant "turn-on." A practical solid state cathode could replace the thermionic cathodes in conventional cathode-ray tubes. It could also serve as an electron source for flat-panel displays; as a source of electrons for microwave traveling wave tubes, gyrotrons and free-electron lasers; and as an electron source for vacuum microelectronics.

Current lithographic and crystal growth technologies are capable of constructing compound semiconductors with layers having thicknesses less than the mean free path of electrons in the material. Over distances of this magnitude, an electron can be accelerated to energies not limited by collisions in the material. Electrons behaving in this manner are termed "ballistic electrons." The effects of lattice vibrations (phonon scattering) within a lattice are reduced when electrons travel ballistically.

A barrier to the development of a practical solid state cathode has been the difficulty in overcoming the work function of the emitting material. Though devices based upon field emission or avalanche emission have met with varying degrees of success, they suffer from inherent drawbacks such as short lifetimes, low emission, and low efficiency.

Recently, the phenomenon of ballistic transport in semiconductors has become recognized for its potential in high-speed electronics. The ability to fabricate thin (10–100 nanometer (nm) layers has made it possible for an electron to travel the length of a layer without experiencing the effects of scattering within the lattice, i.e., "ballistically." Under this condition, an electron acts much like a particle in free space with a reduced mass, and it can be accelerated to considerable energies. At high energies, the electron interaction with the periodic lattice potential becomes stronger, and the velocity peaks to a material dependent value (about $10^8$ centimeters per second (cm/s) in GaAs). This peak velocity is a design objective for ballistic transistors because it results in the shortest transit times through each semiconductor layer; it corresponds to an electron energy of about 0.36 electron volts (e.V.) in gallium arsenide (GaAs) for example.

This disclosure will use terms in the context and sense generally recognized by those skilled in the art of solid state devices. For clarity, unless some other meaning is clear from the context in which a term is used, the following definitions are adopted for purposes of this disclosure.

Accelerate: To increase the energy of an electron by means of an electric potential.

Active Length: The distance over which an electron travels ballistically.

Ballistic Electrons: Electrons whose travel within a material are not limited by collisions within the material.

Ballistic Injector: A device by which ballistic electrons are introduced into a material.

Ballistic Material: A solid state element or compound in which electrons can be caused to behave ballistically. The currently preferred ballistic materials are semiconductors, but metals and insulators may also be capable of this function and may be considered as ballistic materials in specific instances.

Band Gap: The minimum energy required for a valence electron in a semiconductor to become a conduction electron that can move more freely throughout the material.

Compound Semiconductor: a semiconductor made of a compound of two or more elements (instead of a single element like silicon). For example, to make III-V semiconductors, one or more elements having three valence electrons, such as aluminum, gallium, and indium (those in Group III of the periodic table) are combined with one or more elements having five valence electrons, such as phosphorus, arsenic, and antimony (those in Group V).

Depleted Region: A region in a material that is depleted of charge carriers.

Doping: The introduction of a secondary material to the primary material of a semiconductor to provide an excess of charge carriers (either holes or electrons) in the primary material.

Emitter: The stage of a cathode device which allows electrons to exit from the cathode.

Heterojunction: An interface formed by adjacent layers of materials having different chemical compositions.

Injected Electrons: Electrons which are introduced into the environment, a vacuum or a material from an injector.

Injector: A source device of injected electrons.

Intrinsic: An undoped semiconductor material.

Layer Length: The linear distance through a material layer in the direction of current flow.

Majority Carrier: An electron in an n-type doped material or a hole in a p-type doped material.

Minority Carrier: An electron in a p-type doped material or a hole in an n-type doped material.

Mean free path: The average distance an electron can travel between collisions in a material.

Phonon: A quantum of thermal vibration that propagates through a material.

Semiconductor: A material with electrical properties which are intermediate the electrical properties of metals and insulators, respectively.

Tunneling: The quantum mechanical property of electrons which allows an electron to overcome an energy barrier at an energy below the barrier energy.

Work Function: The energy required to remove an electron from a material into a vacuum.

References to "before," "following," or similar terms are with respect to the direction of electron flow in a device.

It is known that an electron can travel ballistically through a material over distances on the order of the mean free path in the material. Over this distance, ballistic electrons can attain kinetic energies far greater than can electrons traveling non-ballistically.

Ballistic behavior of electrons and proposed devices utilizing ballistic electron behavior are discussed in the article "Ballistic Electrons in Semiconductors," Heiblum and Eastman, *Scientific American*, February 1987, pp. 102-111. This article is incorporated by reference in this disclosure for its general explanation of ballistic behavior and devices, particularly its explanation of heterojunctions and other types of ballistic electron injectors. Two types of ballistic injectors are described: planar-doped barrier and tunnel barrier injectors.

In a typical planar-doped injector, a thin layer of beryllium atoms represents a potential hill over which electrons cannot climb. Applying a bias potential across the outside semiconductor layers raises the potential on one side of the hill, allowing electrons to cross the beryllium layer and accelerate down the other side of the hill. The electrons exit ballistically. An advantage of the planar-doped injector is that the velocity of the injected electrons can be controlled by the applied bias.

Structurally, the tunnel injector sandwiches an undoped semiconductor layer between outer layers of doped semiconductor. It depends upon the energy differences between different layers to accelerate electrons. A typical tunnel injector has a thin aluminum gallium arsenide layer sandwiched between doped gallium arsenide surfaces. A bias potential applied across the outside layers allows the electrons to tunnel through the thin intermediate region. When the size of the barrier matches a quarter wavelength of the tunneling electrons, a current peak is achieved. An advantage of the tunnel structure is that by biasing the structure to either side of the current peak, the injected electron current can be modulated.

Although both the planar-doped and tunnel injection devices produce a source of ballistic electrons, they cannot function as solid state cathodes because all of the injected electrons are gathered by a collector.

U.S. Pat. No. 4,352,117 discloses a negative electron affinity device constructed in solid state material by providing a semiconductor body with an electron barrier over most of its surface. A small opening in the barrier exposes the semiconductor material. A negative electron affinity material with a work function lower than the energy of excited electrons in the semiconductor material is placed in contact with the semiconductor material in this opening. Electrons migrate non-ballistically to this opening, and are injected into the environment through the lower work function material.

SUMMARY OF THE INVENTION

According to this invention, solid state ballistic electron injectors are enhanced; e.g., by cathode accelerator grid expedients, to construct a solid state cathode. The resulting device avoids the major drawbacks of other proposed solid state cathodes, such as material breakdown, poisoning, and desorption, while providing unique advantages, such as high efficiency and high current densities. The device further allows for control over the velocity and current density of the emitted electrons up to the maximum values possible in the ballistic material from which they are emitted.

The invention may be viewed as a solid state cathode device, which may be embodied in a variety of structural arrangements. Alternatively, the invention may be viewed as a method for operating a ballistic electron injector. A notable aspect of this invention is the provision of a novel type of ballistic electron injector capable of overcoming the work function of the emitter surface.

In its most generalized form, a cathode of this invention is created by ballistically accelerating the electrons of a ballistic material to an energy level higher than the energy barrier between the ballistic material and a vacuum.

A solid state cathode may be constructed by the selection and arrangement of materials to take advantage of the ballistic electron transport phenomenon. Electrons are thereby accelerated within a ballistic material to energies greater than the work function of the material. The resulting cathode has many advantages over other proposals.

A high current beam is possible with a sharply defined energy distribution. Consequently, the efficiency of the cathode is high. There is little wasted energy due to the collection of electrons with energies below the work function, in contrast to the solid state avalanche cathode. The claimed device is easier to build into emitter arrays than is the case with field emitters. Accordingly, there is no need for emission tips which characteristically degrade over time. Further, emission occurs over a larger area than occurs in field emission tips, leading to more uniform and higher density electron beams. Moreover, the electron emission density can be modulated to provide a prebunching mechanism for traveling wave tubes or for vacuum microelectronic devices. The high velocities of the ballistic electrons provide short transit times through the material and consequently support high frequency applications.

It is within contemplation to treat the surface of a ballistic material to reduce its work function, making it easier to launch an electron into free space. For example, Gallium Arsenide (GaAs) has a measured mean free path of about 1000 angstroms (Å) at room temperature. The breakdown voltage of this material is estimated to be about $4 \times 10^5$ volts per centimeter (V/cm). Accordingly, an electron can conceivably attain 4 electron volts (e.V.) of energy within GaAs material. According to this invention, the work function for gallium arsenide can be reduced to about 1.4 e.V. Thus, an electron can be launched into free space from the treated GaAs quite easily. This effect is generally applicable to any solid state material which has a relatively long mean free path and a high breakdown voltage. For example, silicon is presently regarded as unsuitable for the construction of a cathode because a similar calculation produces electron energies of only 0.8 e.V., while indium antimonide may be more suitable than gallium arsenide, having maximum electron energies approaching 20 e.V.

A cathode device of this invention includes a means for controlling the ballistic electron current. Controlling this current finds practical application in turning the cathode on and off or as a prebunching mechanism for an amplifying device. By varying the biasing potential across the cathode, the final exit energy of the ballistic electrons is adjusted. Because the density of the injected ballistic electrons depends upon the injector potential, this density will also be modulated through the bias potential. It is thus sometimes desirable separately to control the injector and accelerator potentials, should these regions be separate, to provide control over both electron energy and current density.

A separate stage of the cathode device may be built to control the ballistic electron current. This section may be placed anywhere in the path of the ballistic electrons. For example, a grid may be placed outside the cathode as is conventional in thermionic cathodes. A potential is applied to the grid to control the electron current. Alternatively, a base region may be constructed within the cathode in the path of the ballistic electrons in a ballistic transistor. Other constructions position a conductive structure within one of the regions of the device so that a negative potential can be used to pinch off the current as in a field effect transistor. An advantage of a separate control mechanism is that the current density may then be controlled separately from the electron energy. The high transit velocities of the ballistic electrons through the control structure will allow for high frequency modulation of the electron current.

BRIEF DESCRIPTION OF THE DRAWINGS

In the drawings, which illustrate what is currently regarded as the best mode for carrying out the invention.

DESCRIPTION OF THE ILLUSTRATED EMBODIMENTS

Figure 1:
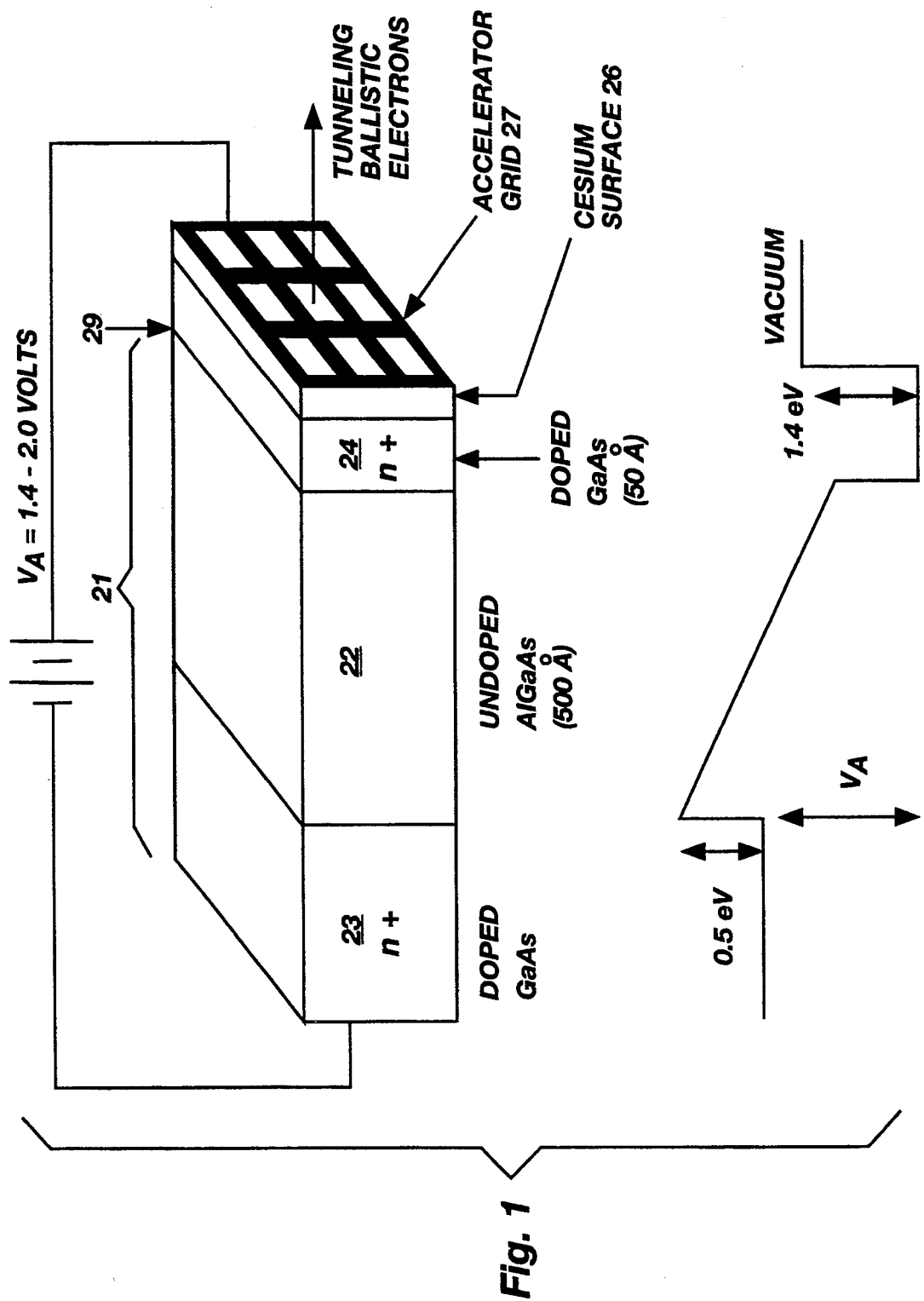
FIG. 1 is a pictorial illustration with a corresponding energy diagram descriptive of a typical tunnel injector ballistic cathode of this invention.

Fundamental to this invention is a means to accelerate electrons to a high energy and inject them ballistically into a region. The region may be comprised of either ballistic or non-ballistic material. A relatively simple such means is the tunnel injector 21 shown by FIG. 1. A thin (e.g. 500 Å) aluminum gallium arsenide layer 22 is sandwiched between two n-doped gallium arsenide layers 23, 24. The AlGaAs layer 22 has a larger band gap than the GaAs layers 23, 24, so that a potential hill exists between the two materials over which electrons cannot flow, but through which they can tunnel. A potential (e.g. 2 volts) is applied across the device 21 as shown. Any electrons tunneling across the AlGaAs layer 22 will exit with an energy approximately equal to the applied potential. The second GaAs layer 24 is made relatively thin (e.g. less than 500 Å), so that any electrons entering this region ballistically will encounter few, if any, collisions. A cesium activated surface 26 lowers the work function of the material to about 1.4 e.V., so that the electrons have enough energy to exit the cathode 21. A metallic grid 27 on the exit surface of the cathode completes the structure by providing an ohmic contact to the outer GaAs layer 24 structured to permit the emitting of electrons from the device.

Figure 2:
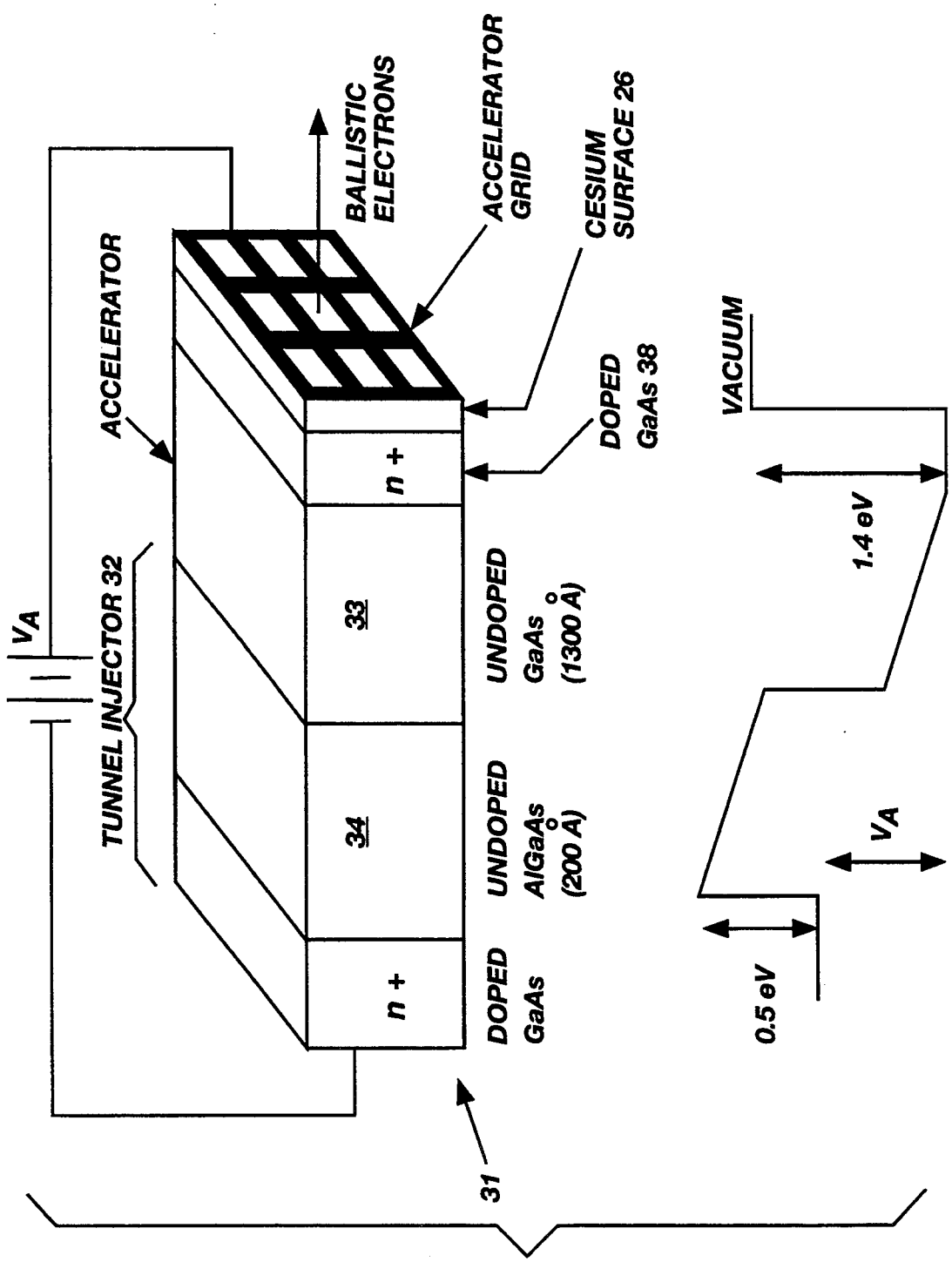
FIG. 2 is a pictorial illustration with a corresponding energy diagram descriptive of an alternative tunnel injector ballistic cathode.

It may occur that the length of the tunnel region 22 (FIG. 1) is too long to get a sufficient current density on the output surface 29 of the tunnel. In that case, a cathode 31 may be built in two sections, as shown by FIG. 2. As illustrated, a ballistic injector 32 is followed by a GaAs accelerator region 33 having n+ doped region 38. A thin tunnel injector 34 is used to obtain a large injection current density.

Figure 3:
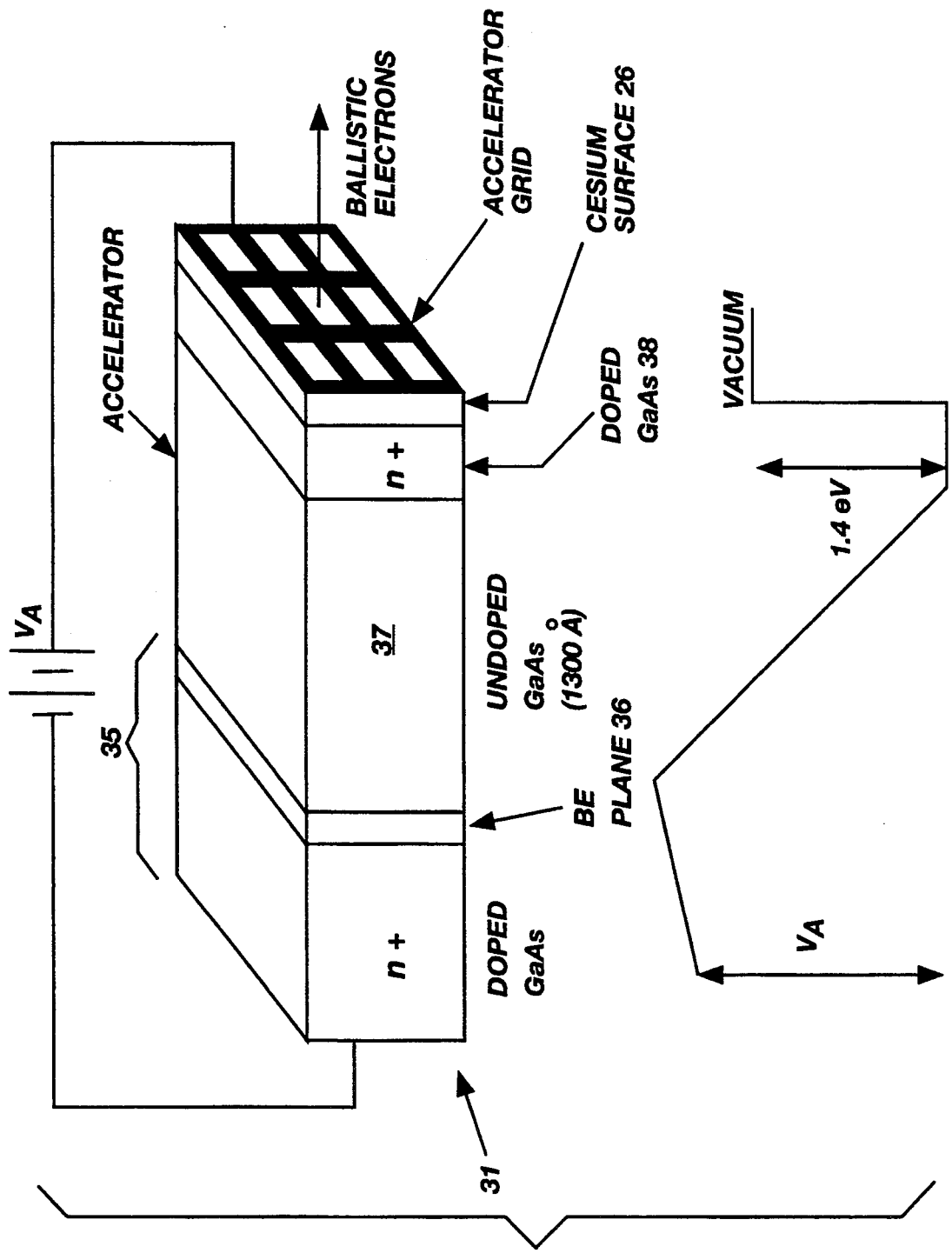
FIG. 3 is a pictorial illustration with a corresponding energy diagram descriptive of a typical planar-doped injector ballistic cathode of this invention.

FIG. 3 illustrates a planar-doped injector 35 in which a thin layer 36 of beryllium atoms provides a potential hill over which electrons cannot climb. Applying a potential lowers this hill, allowing electrons to spill over to the other side and to exit ballistically into accelerator region 37 toward n+ doped region 38. An advantage of the planar-doped injector is that the injection velocity of the electrons may be precisely controlled by adjusting the bias potential $V_A$.

It should be understood that other types of injectors are within contemplation and can be substituted for those illustrated in the construction of cathodes in accordance with this invention.

Both FIGS. 2 and 3 illustrate ballistic injectors 32, 35, respectively, followed by an intrinsic GaAs layer 33, 37, respectively, of lengths on the order of (or less than) the mean free path for electrons. A high potential exists across the lengths of the GaAs layers 33, 37 to accelerate electrons to their final exit velocities. The accelerator 33, 37 material is made intrinsic to lower leakage current and to provide an acceleration region devoid of charges which can impede the flow of ballistic electrons. A contact to the ballistic injector 32, 35 need not be made if the lengths and doping levels of each region are made to give the correct potential across each layer. It is sometimes advantageous to provide such a contact so that the potential drop across the injector region may be separately controlled.

It is expected that this device will attain a very high final current density. Current densities approaching 60,000 Amps per square centimeter (A/cm$^2$) can be injected into the acceleration region using a tunnel injector. The final emission of the device will then be limited theoretically by the electron collection and scattering processes within the material. Practical constraints, however, will limit the power dissipation and contact diode breakdown of an actual device. Nevertheless, actual emission current densities are presently expected to be at least an order of magnitude above those obtainable through current cathode technology.

The cathode devices illustrated by FIGS. 2 and 3 offer several important advantages. Precise control of the cathode brightness/emission current density is provided by either the tunnel injector (FIG. 2) or the planar doped injector (FIG. 3). The current can be adjusted or modulated by varying the injector voltage. Because the maximum electron energies achieved can be several electron volts above the work function of the emitting material, the emitted electrons can exit with considerable energy. By comparison, even high temperature thermionic cathodes can achieve emission electrons of only a few tenths of an electron volt. The cathodes of this invention also provide high quality, sharply defined beam energy with little velocity spread. Because the claimed devices do not pull off electrons having a widely spread energy curve (as in the thermionic cathode or the avalanche cathode), the exiting electrons are characterized by a very small spread in their respective velocities. High quality beams are thus achievable. Cathodes of this invention are not restricted to points as are field emission devices. Accordingly, a large emitting surface may be fabricated. The parameters of the claimed device are well within existing manufacturing capabilities.

Ballistic electron injectors with efficiencies approaching 90 percent have been demonstrated, indicating the practicality of a very efficient cathode based upon this invention.

Semiconductor materials other than gallium arsenide are within contemplation. Indium antimonide is currently regarded as a preferred material because of its long mean free path. Another material of interest is InGaAs because of its high injection current efficiency (0.9 versus 0.75 in GaAs). Solid state materials other than semiconductors are also potentially useful, provided they are characterized by sufficiently high mean free paths and breakdown voltages.

Figure 4:
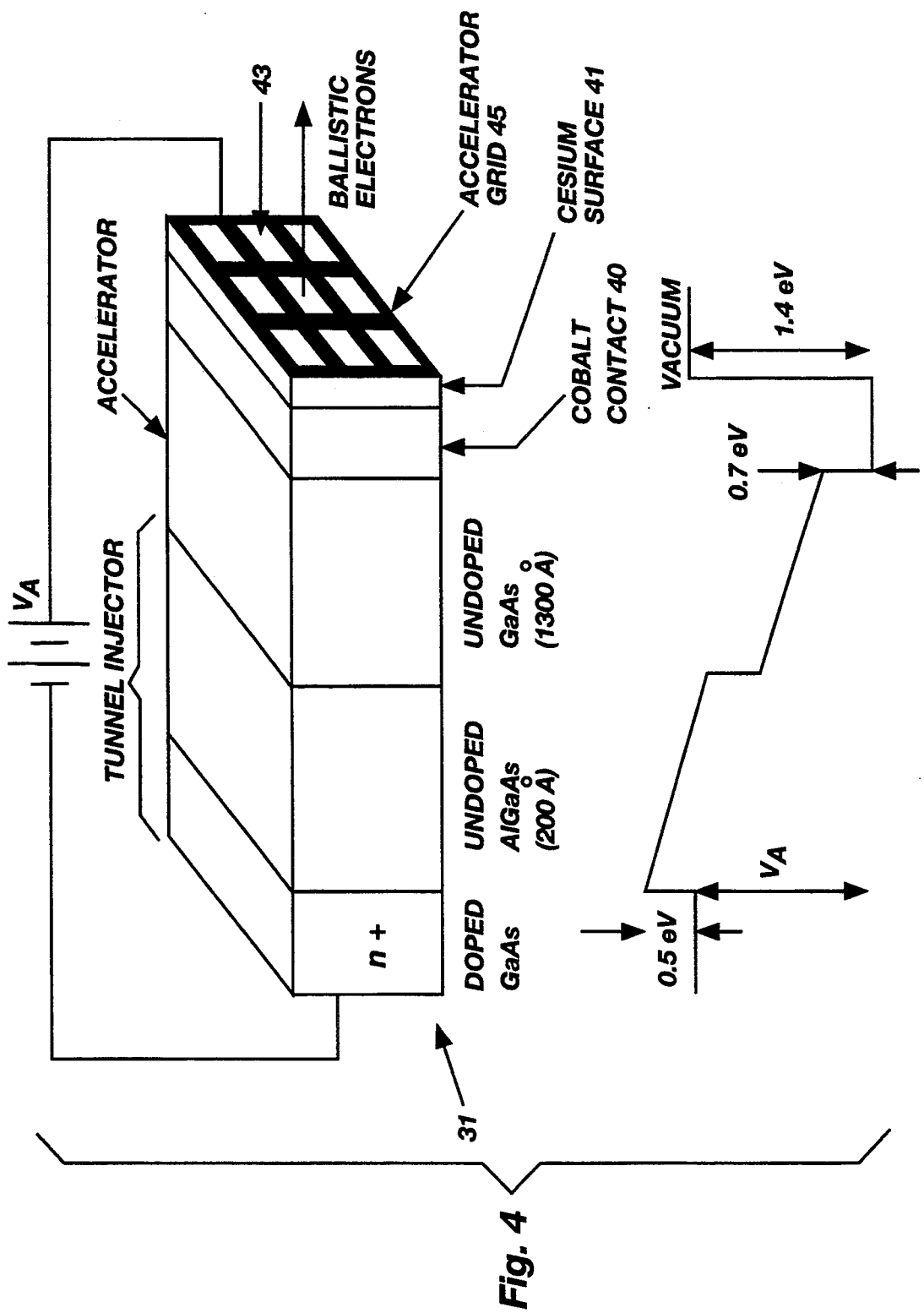
FIG. 4 is a pictorial illustration with a corresponding energy diagram descriptive of a ballistic cathode of this invention with a cobalt impregnated emitting layer.

According to alternative embodiments of the invention, the exit surface of the cathode may be modified. As shown by FIG. 4, a thin layer 40 of metallic material may be diffused into the surface of the cathode to improve the ohmic contact. In this case, the conventional final layer of GaAs is unnecessary. Transition metals such as cobalt or nickel are useful for this purpose. The diffused layer 40 should be thin because the mean free path of metals is short (about 80 Å in the case of cobalt). Cobalt layers of only a few atoms thick are feasible, however.

It is currently understood that a diffused layer, such as the cobalt layer 40 illustrated, retains the properties of the semiconductor, e.g. gallium arsenide. Thus, a cesium activator 41 may be deposited on the cobalt surface as illustrated. The cobalt layer will lower the ohmic losses of the structure, due to the resistivity of the layer, making it practical to fabricate devices with a larger surface area in the holes 43 of a metallic bias grid 45. In the absence of a cobalt layer 40, a potential across the cathode would be expected to lead to eventual cesium migration. A good ohmic contact is expected to reduce this effect, leading to an extended cathode lifetime.

The metallization layer 40 also provides a means for adjusting the band gaps of the various layered materials in a cathode device to give the ballistic electrons added energy. Cobalt, being a metal, has no band gap. Accordingly, at a GaAs/cobalt interface, a potential drop of approximately 0.7 e.V. exists. This potential drop provides the electrons with an added boost into free space. Because this property is common to all metals, metals other than cobalt may be preferred for specific devices.

Figure 5:
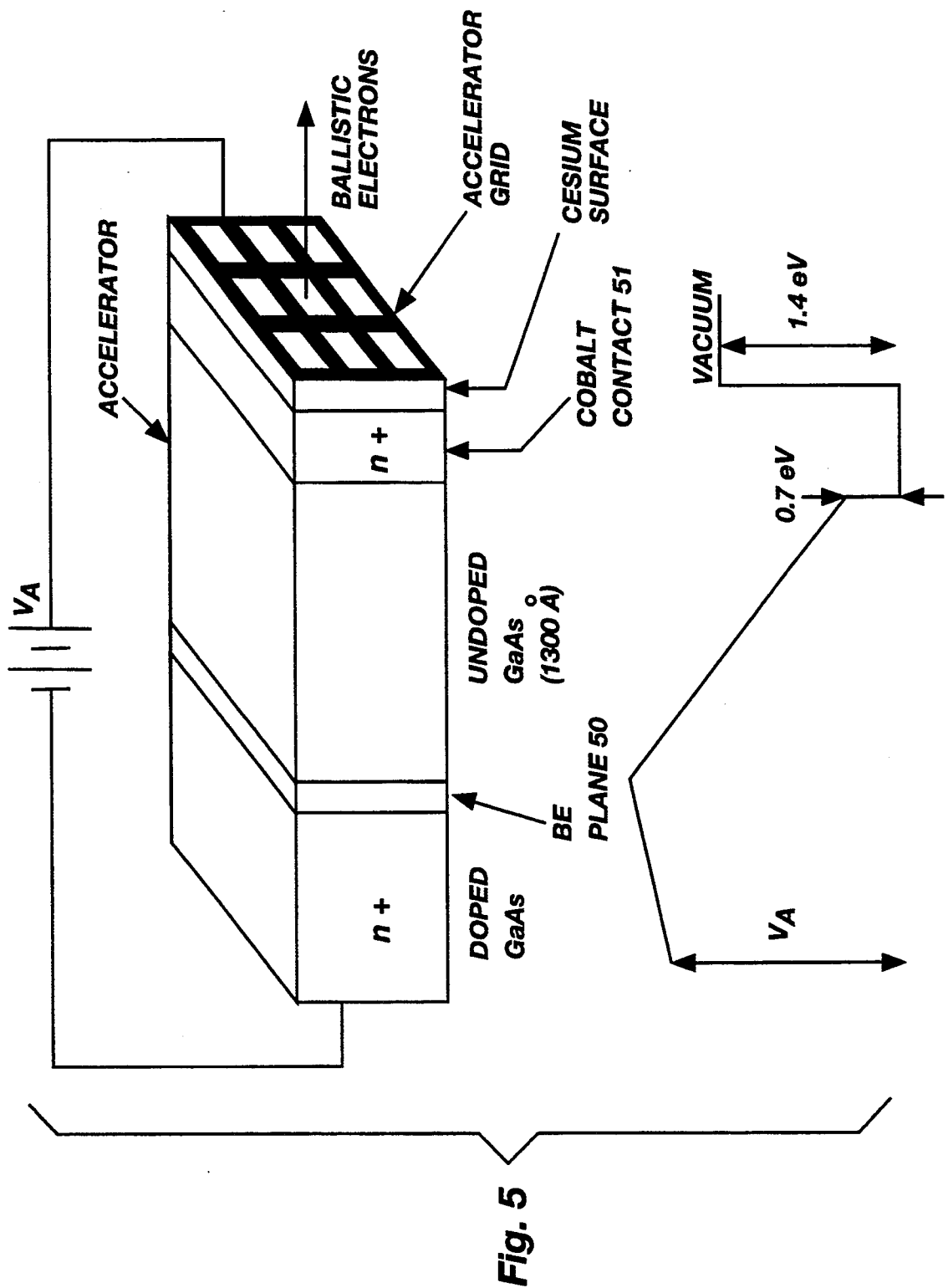
FIG. 5 is a pictorial illustration with a corresponding energy diagram descriptive of a cathode similar to FIG. 4 with a metal heterojunction.

The materials of construction of the injection/acceleration regions of a cathode device may be selected on the basis of their specific band gaps to boost electron energy as illustrated by FIG. 5. The energy difference between the AlGaAs and GaAs heterojunction 50 is about 0.5 e.V., providing an extra boost to the electrons crossing this plane. Combining a junction 50 of the type with a cobalt metal outside layer 51 reduces the minimum exit energy of the electrons by a total of 1.2 e.V. The use of band gaps to advantage in this fashion is not restricted to semiconductor materials. Various materials which are compatible with the cathode device may be used to give added boosts to the ballistic electrons.

Figure 6:
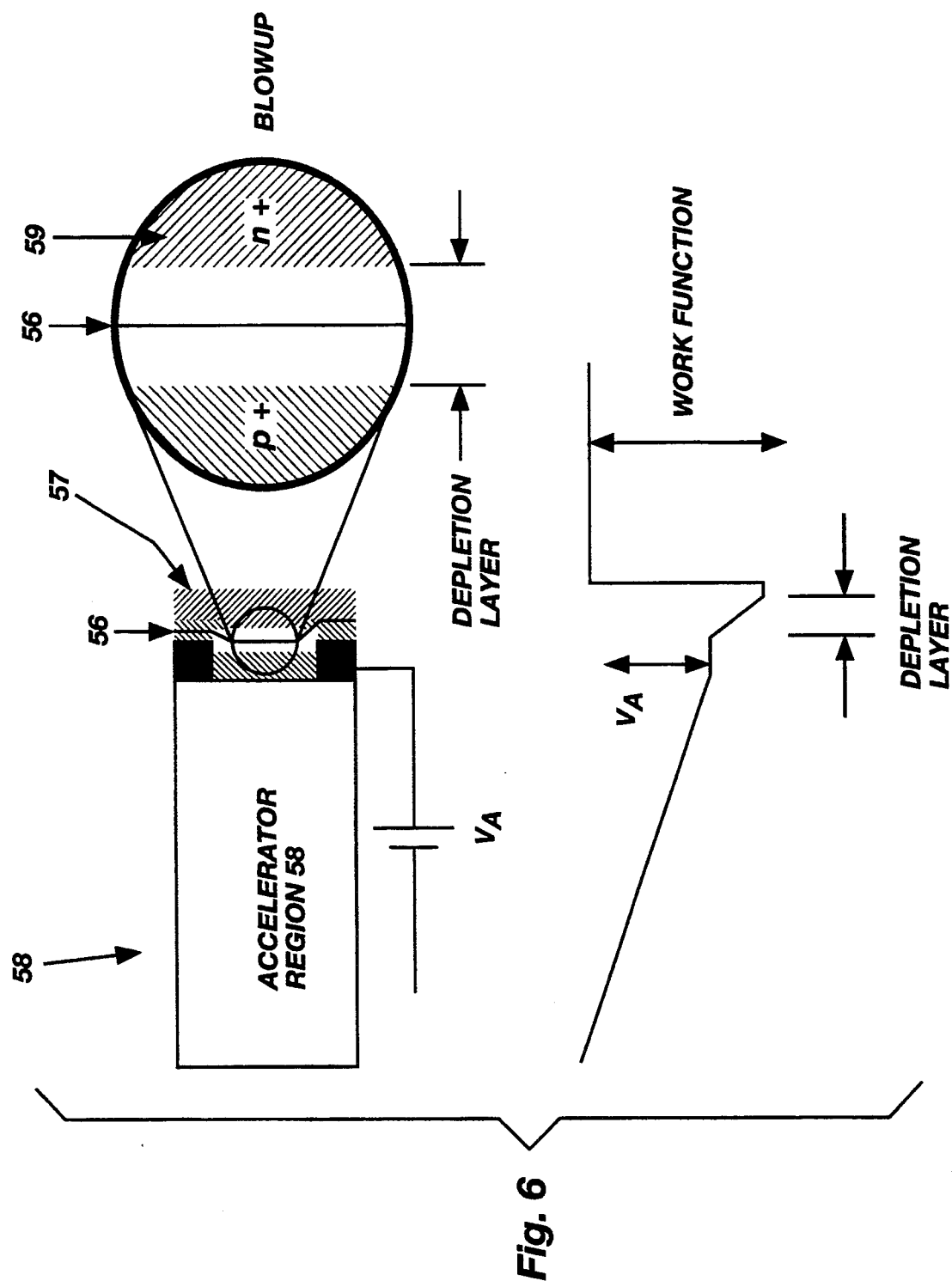
FIG. 6 is a generalized diagrammatic representation of the ballistic cathode of this invention and a corresponding energy diagram illustrating doping of the exit layer.

Doping may also be used to provide an added electric field by which to boost the ballistic electrons. For example, a pn junction 56 may be placed at the emitting end 57 of a cathode 58, as shown by FIG. 6. An electric field exists to maintain the depletion region across the junction 56. This electric field provides an added boost to transitting electrons, leading to a lowering of the material work function. If the junction 56 is made thin enough, electrons are able readily to transit through to the vacuum.

The junction 56 need not comprise p-type GaAs followed by n-type GaAs. For example, a metal such as cesium may be substituted for the n-type region 59. The excess electrons from the metal inevitably cross the junction, thereby creating a depletion region and a boosting field, respectively similar to those obtained at the pn junction illustrated.

By combining appropriately designed tunneling/acceleration regions, modified band gaps of the layered materials, and doping, electrons may be emitted into free space directly without reliance upon a cesium activator on the cathode surface. By avoiding the migration and evaporation of cesium, the expected lifetime of the cathode is significantly extended.

Figure 7:
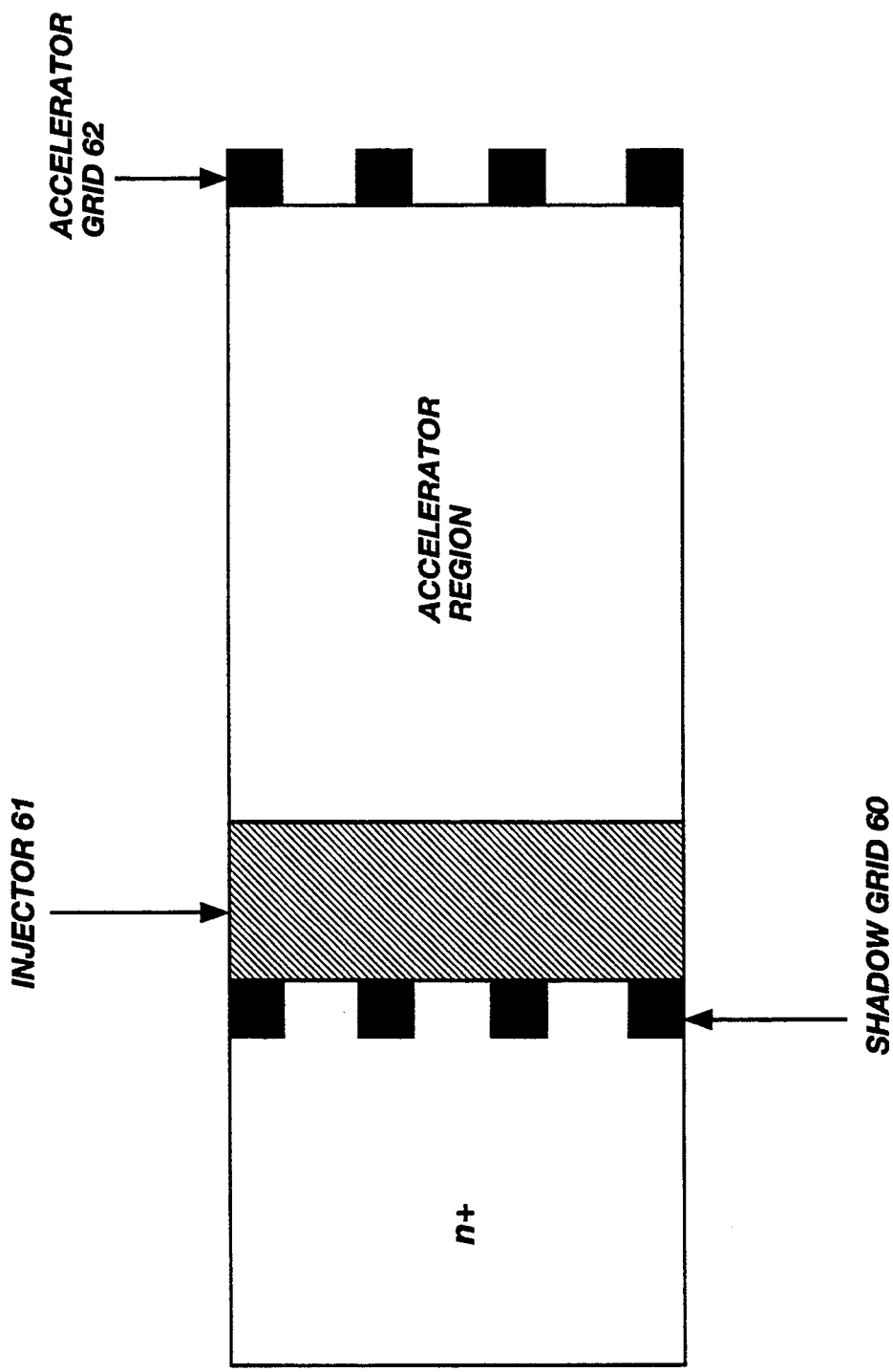
FIGS. 7 and 8 are diagrammatic representation of alternative grid arrangements useful in the practice of this invention.
Figure 8:
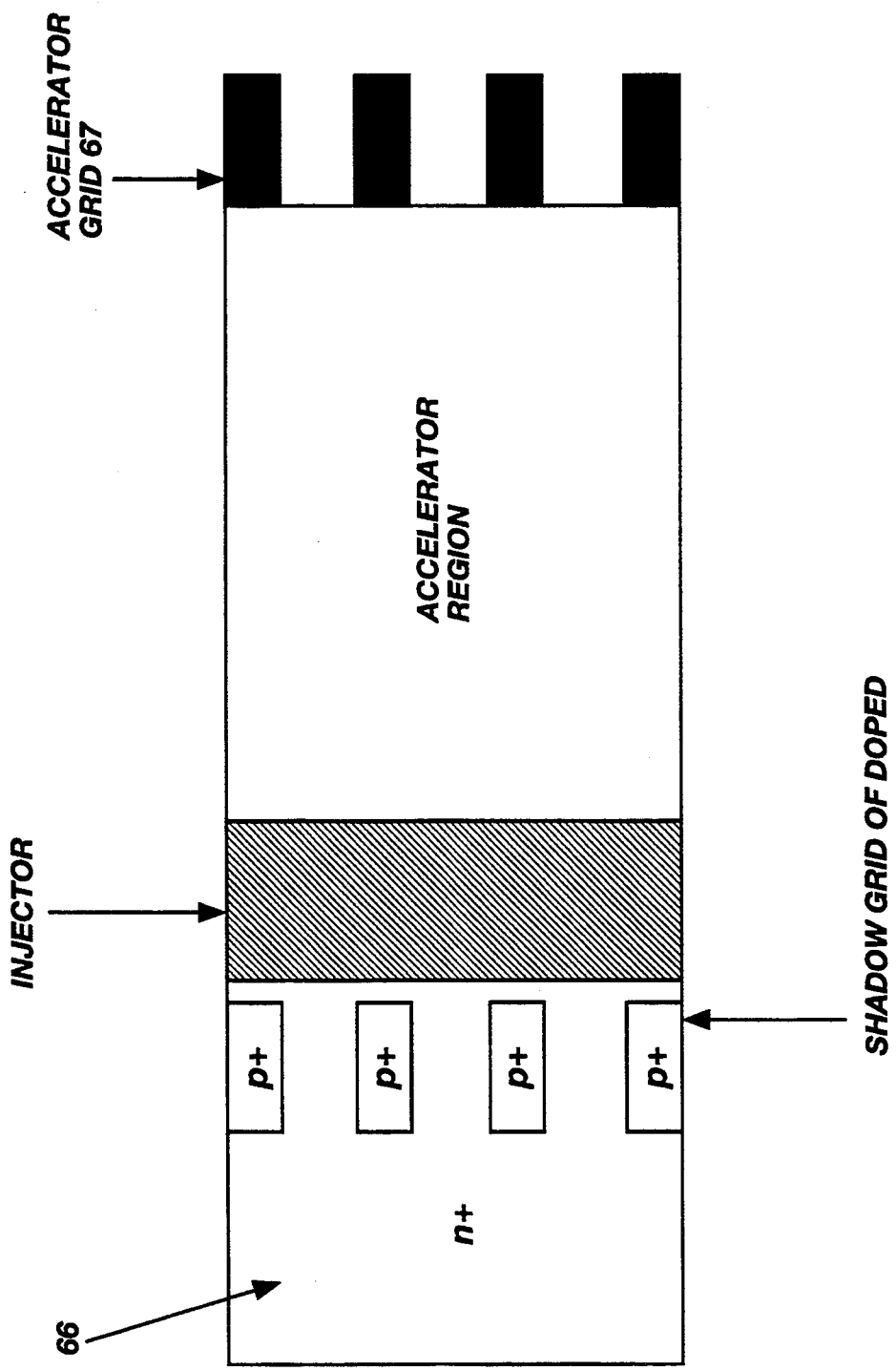

The efficiency of the cathodes of this invention are inherently high, because once electrons are boosted to ballistic velocities, their paths tend to remain unimpeded even with collisions. Reduced efficiency will result from current collected by an outside metallic grid incorporated in the device. Alternative means for reducing this wasted collection of current are illustrated by FIGS. 7, 8 and 9.

Structural means may be incorporated to pattern electron flow, thereby reducing the collection of electrons by the bias grid. For example, FIG. 7 illustrates the placement of a "shadow grid" 60 before the injector 62 to block the flow of current which would otherwise be collected by the outside grid 62. The configuration of the shadow grid 60 is approximately congruent with that of the bias grid 62. FIG. 8 illustrates an alternative arrangement in which the placement of p-doped regions 65 into the first GaAs region 66 to prevent current flow to an outside grid 67.

Figure 9:
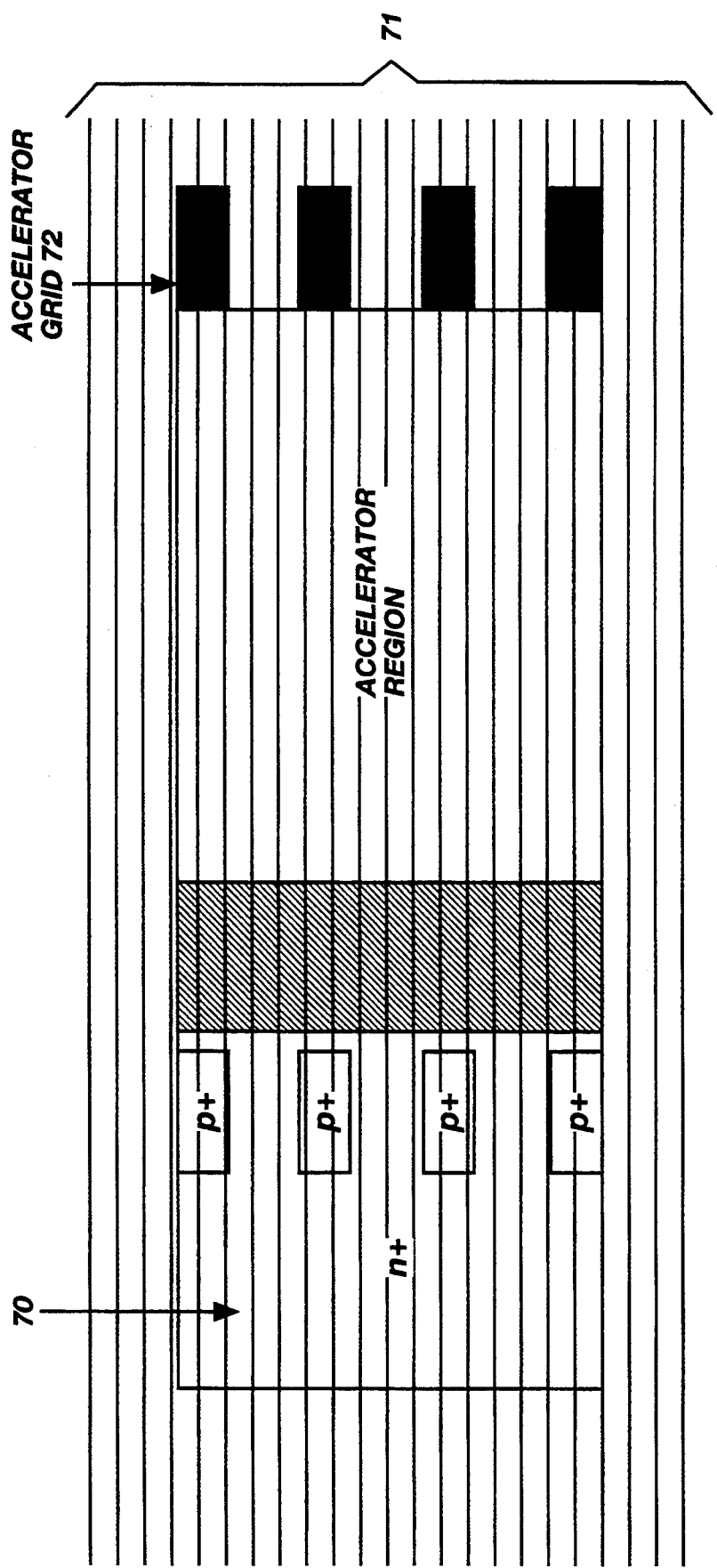
FIG. 9 is a diagrammatic representation of a cathode of this invention immersed in a magnetic field.

FIG. 9 illustrates immersion of a cathode 70 in a magnetic field 71. By this means, ballistic electrons are encouraged to follow the magnetic field lines. The field thus impedes the flow of current traveling on the surface of the cathode 70 to the metallic grid 72. Leakage is therefore reduced. Moreover, those ballistic electrons experiencing collisions are urged by the field to the main path of the ballistic electrons to the outside world.

Figure 10:
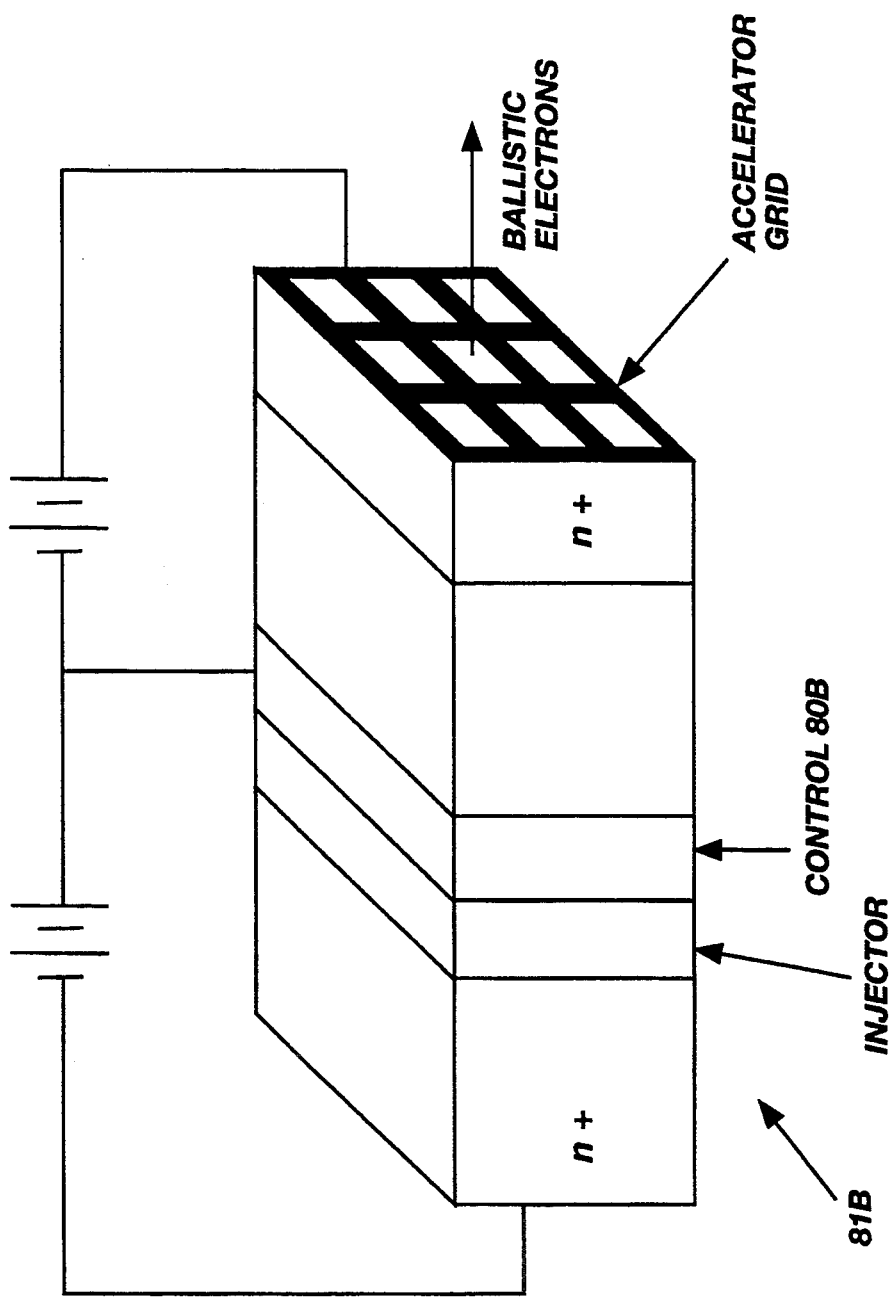
FIG. 10 is a generalized pictorial representation of a cathode of this invention with a current modulation control region.
Figure 11:
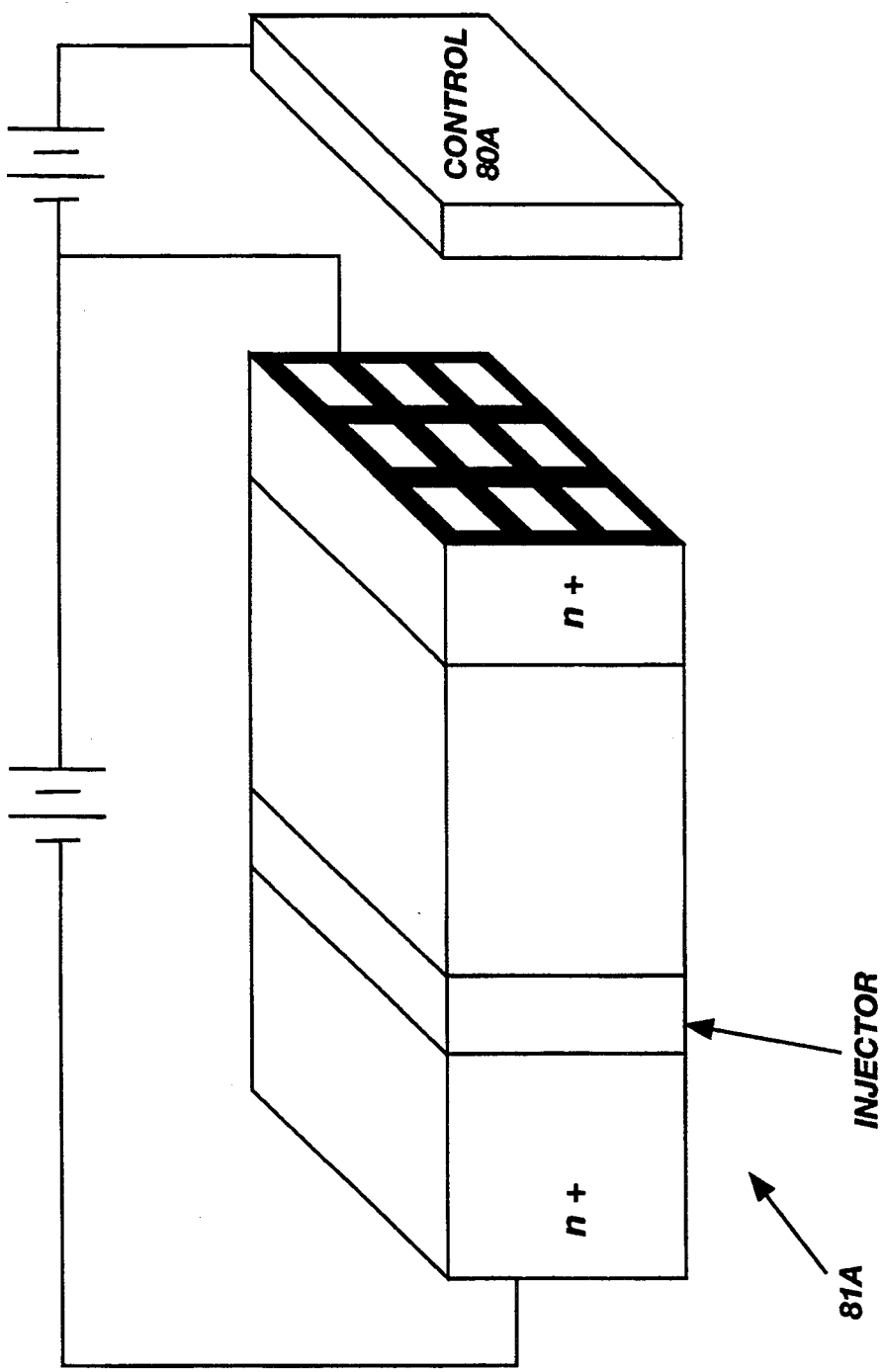
FIG. 11 is a generalized pictorial representation similar to FIG. 10 with the control region alternatively located external the cathode.

FIGS. 10 and 11 illustrate alternative placements of a control structure 80 into the fundamental cathode device 81. FIG. 11 illustrates a grid 80A external to the cathode 81A. A negative potential applied to the grid 80A decreases the flow of electrons through the grid. FIG. 10 illustrates a thin base region 80B in the path of the ballistic electrons. A potential is placed on this base 80B to control the flow of ballistic electrons through the base. Schemes other than the two specifically illustrated are envisioned in which a current modulation control region is placed in other parts of the cathode or in which other materials (e.g. metals) are used as a control element.

Figure 12:
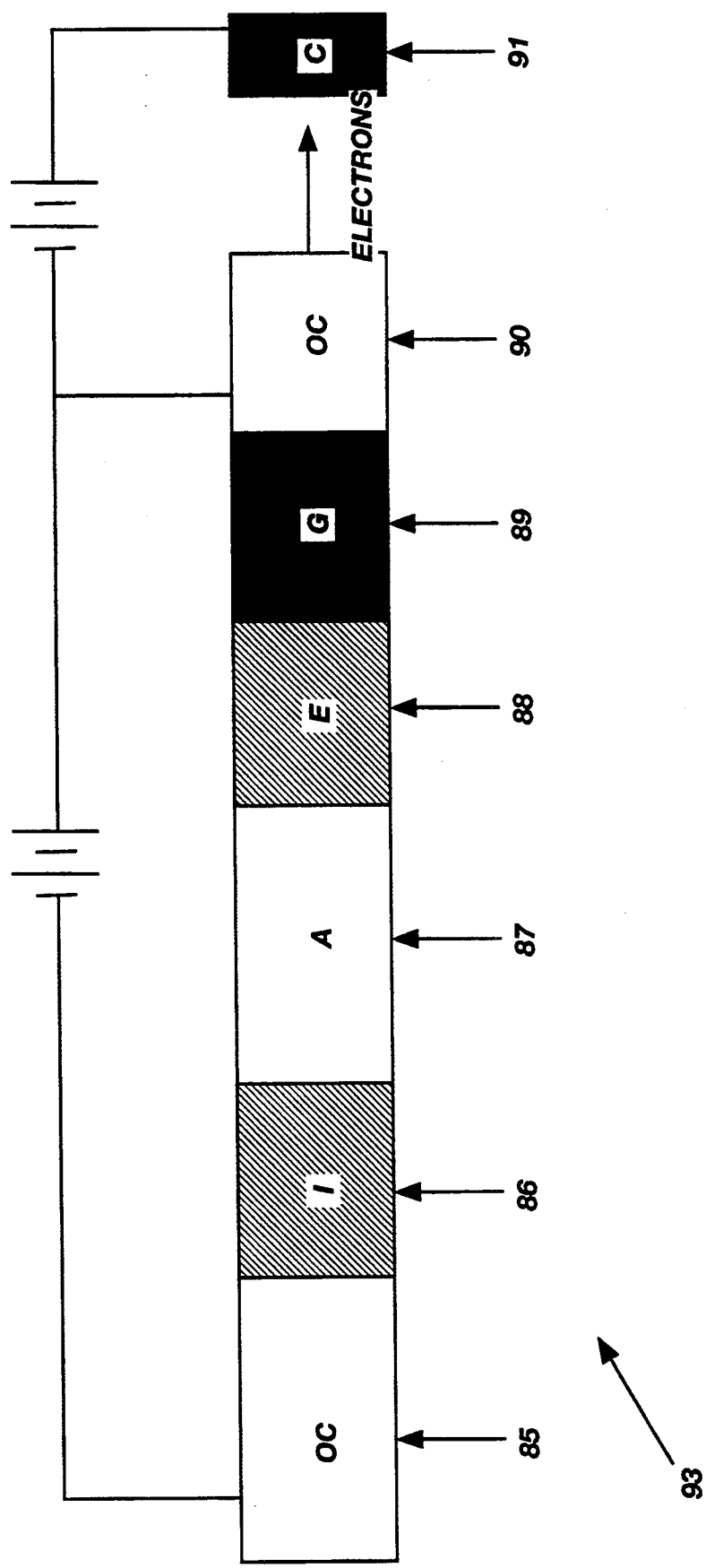
FIG. 12 is a schematic illustration showing fundamental stages which may be incorporated into a cathode of this invention.
Figure 13:
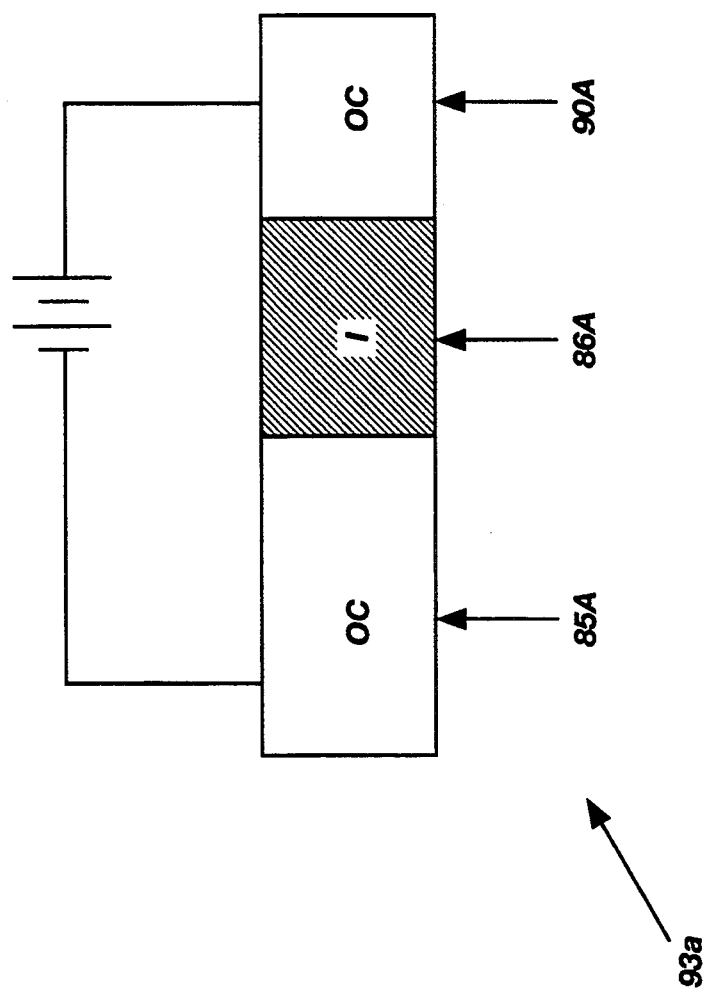
FIG. 13 is a schematic illustration of the fundamental stages generally regarded as essential to the invention.

FIGS. 12 and 13 illustrate the versatility of this invention from the standpoint of configuring practical devices in a variety of structural arrangements.

FIG. 12 illustrates possible fundamental stages which can be selected; namely, a first ohmic contact 85, an injector 86, an accelerator 87, an emitter 88, a grid 89, a second ohmic contact 90, and a control region 91. Of course, the control region 91 may be variously located as described in connection with FIGS. 10 and 11. Most of the stages are useful enhancement means which may be operably associated with an emitting surface of an emitter 88 to adjust the energy levels of the ballistic electrons provided by the injector 86. FIG. 13 illustrates the device 93 reduced to its most basic configuration. As shown by FIG. 13, a cathode 93A may be constructed with a first ohmic contact 85A, an injector 86A and a second ohmic contact 90A which functions as an emitter due to proper selection of materials and dimensions.

Figure 14:
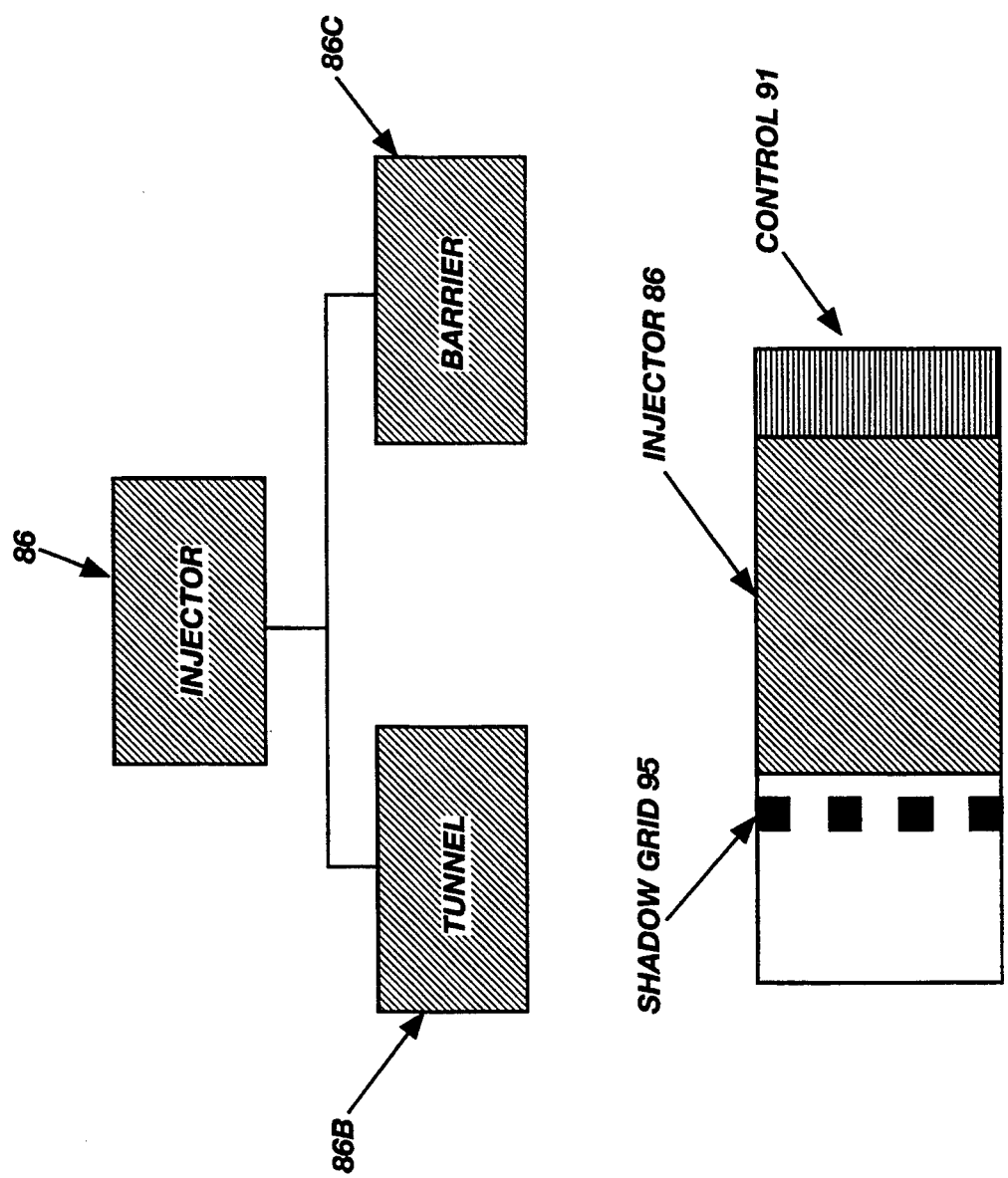
FIGS. 14, 15 and 16 are branch schematic diagrams presenting alternative design choices of injector, acceleration, and emitter stages useful for cathodes of this invention.
Figure 15:
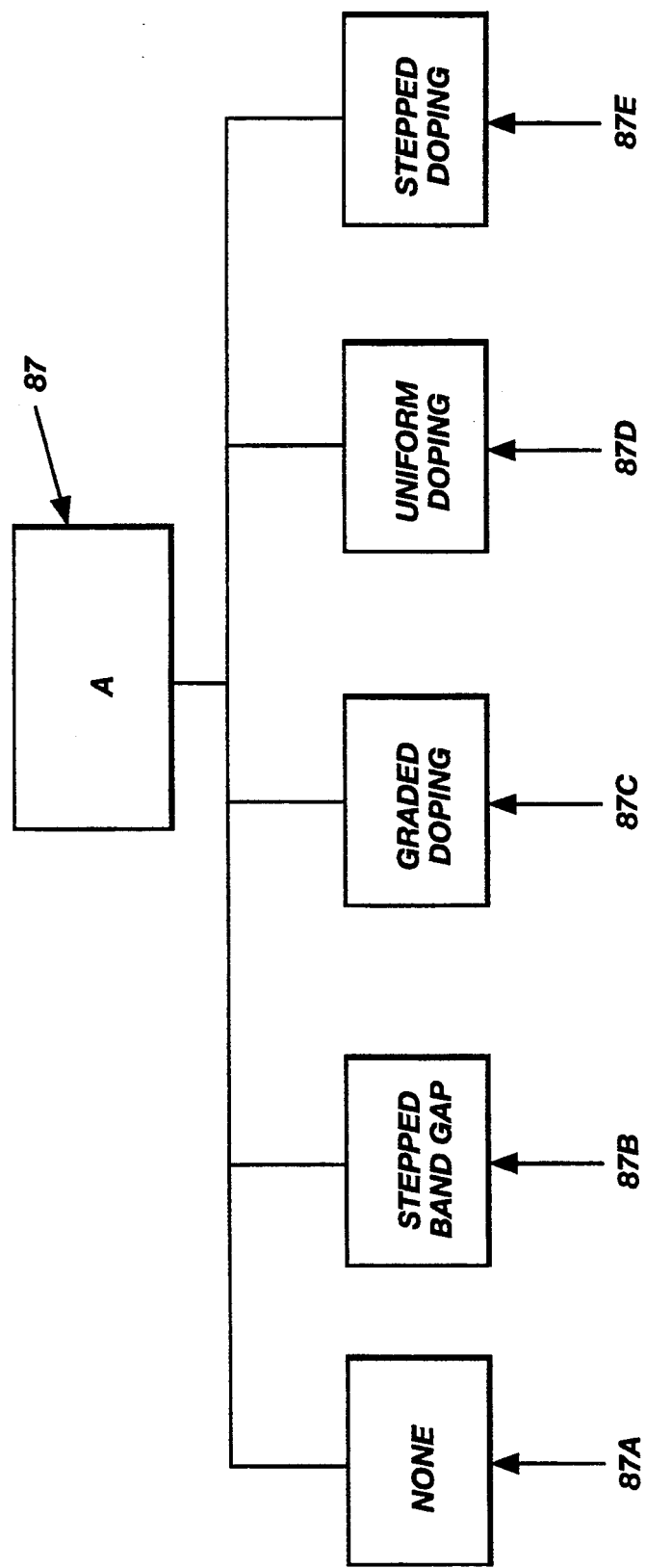
Figure 16:
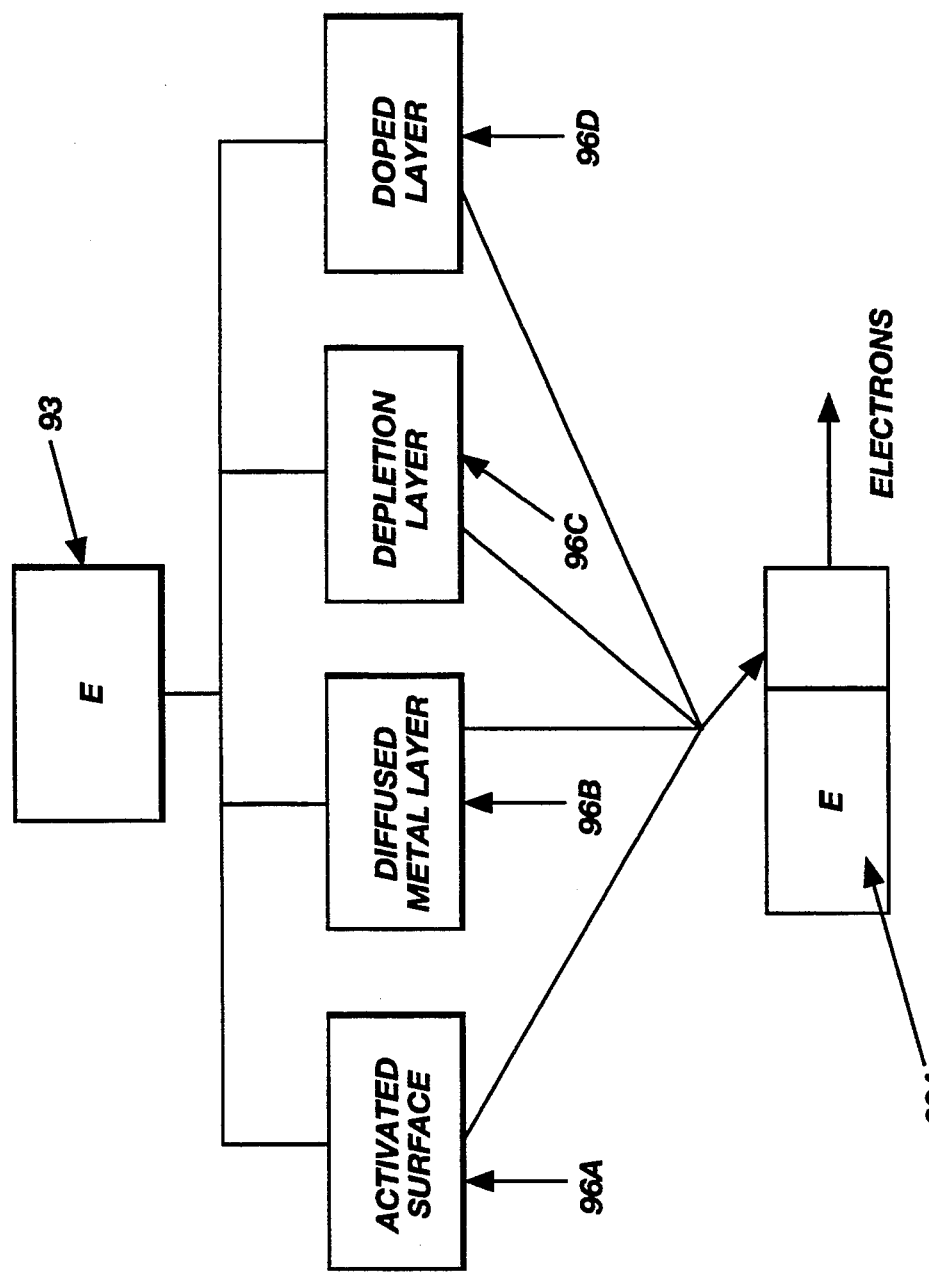

As previously noted, the injector may be selected from various types, including the tunnel injector type 86B and the barrier type 86C (FIG. 14). In either case, the injector 86 may be associated with shadow grid 95 or equivalent structures or with control regions 91 as illustrated. FIG. 15 presents a selection of accelerator 87 expedients 87A, B, C, D, E, any of which may be utilized in the arrangement illustrated by FIG. 12 in association with other stages. FIG. 16 presents a selection of modification expedients 96 for the emitter 93. Any of the emitters 93A resulting from the modifications 96A, B, C, or D may be selected for use in combination with various accelerators 87, injectors 86 and other constructions in the arrangements shown by FIG. 12.

The ballistic electron cathodes of this invention avoid the major defects of other cathode schemes, and possess several significant advantages. The generation and control of ballistic electrons provides a cathode with high-quality, high-current density beams that are easily and precisely controlled. The high velocity of ballistic electrons shortens the transit times of electrons through materials and decreases the scattering effect of the semiconductor materials. The resulting cathodes are thus characterized by high efficiencies and high-modulation frequencies. The sharp energy spectrum of ballistic electrons is also advantageous for low-noise electron beams. The cathode is simple to fabricate into arrays of flat, high-brightness emitters. Long lifetimes are feasible because of the absence of field emitting tips. Moreover, cathodes may be constructed without a surface activator, thereby avoiding the migration and desorption problems characteristic of such activators.

Reference herein to details of the illustrated embodiments is not intended to restrict the scope of the appended claims which themselves recite those features regarded as important to the invention.

What is claimed is:

1. A ballistic electron solid state cathode comprising:
   an emitting surface for emitting elections, said emitting surface having a work function, and said electrons having energy levels associated therewith;
   a ballistic electron injector for injecting said electrons to travel ballistically within the solid state cathode before leaving said emitting surface; and
   enhancement means operably associated with said emitting surface for adjusting said energy levels of said electrons travelling ballistically within the solid state with respect to said work function of said emitting surface so that said energy levels exceed said work function and said electrons are thereby emitted from said emitting surface.

2. A cathode according to claim 1, wherein said enhancement means includes bias means for applying a potential between said injector and said emitting surface to increase the energy levels of said electrons to approximately said potential.

3. A cathode according to claim 1, wherein said emitting surface is activated with a material effective to reduce the work function of said surface.

4. A cathode according to claim 3, wherein said enhancement means includes bias means for applying a potential between said injector and said emitting surface whereby to increase the energy level of said electrons to approximately said potential.

5. A cathode according to claim 1, including a metallic grid disposed on said emitting surface constituting an ohmic contact.

6. A cathode according to claim 5, wherein said enhancement means includes bias means for applying a potential between said injector and said emitting surface whereby to increase the energy levels of said electrons to approximately said potential.

7. A cathode according to claim 6, wherein said emitting surface is activated with a material effective to reduce the work function of said surface.

8. A cathode according to claim 1, including a first ohmic contact associated with said injector and a second ohmic contact associated with said emitting surface.

9. A cathode according to claim 8, wherein said second ohmic contact comprises a conductive material in ohmic relationship with said emitting surface.

10. A cathode according to claim 9, wherein said second ohmic contact comprises a conductive grid.

11. A cathode according to claim 1, wherein said emitting surface comprises a junction of two materials selected so that a depletion layer created at said junction effectively lowers the work function of said surface.

12. A cathode according to claim 1, wherein said enhancement means includes an accelerator region located for receiving said electrons from said injector, said accelerator region comprising a layer of material with band gap characteristics and doping levels selected to enhance the energy levels of said electrons.

13. A cathode according to claim 12, wherein said accelerator region further comprises a plurality of layers of material with band gap characteristics and doping levels selected to enhance the energy levels of said electrons, each layer of said plurality of layers having a different composition than that of adjacent layers.

14. A cathode according to claim 12 wherein said accelerator region includes a layer in which the doping level is characterized by a concentration gradient.

15. A cathode according to claim 12, wherein mid enhancement means further includes bias means for applying a potential between said injector and said emitting surface whereby to increase the energy levels of said electrons to approximately said potential.

16. A cathode according to claim 15, wherein said emitting surface is activated with a material effective to reduce the work function of said surface.

17. A cathode according to claim 16, wherein said emitting surface comprises a junction of two materials selected so that a depletion layer created at said junction effectively lowers the work function of said surface.

18. A cathode according to claim 16, including a first ohmic contact associated with said injector and a second ohmic contact associated with said emitting surface.

19. A cathode according to claim 18, wherein said second ohmic contact comprises a conductive material in ohmic relationship with said emitting surface.

20. A cathode according to claim 19, wherein said second ohmic contact comprises a conductive grid.

21. A cathode according to claim 20, wherein said conductive grid is a metallic grid.

22. A tunnel injector ballistic electron cathode comprising:
an emitting surface for emitting electrons, said emitting surface having a work function, and said electrons having energy levels;
a first layer of semiconductor material for injecting said electrons ballistically;
a second layer of semiconductor material for providing a potential barrier to said electrons with respect to the material of said first layer;
a third layer of material constituting means for conducting said electrons ballistically within said third layer prior to leaving said emitting surface associated with said third layer; and
electrical contacts for applying a potential across said three layers.

23. A cathode according to claim 22, wherein said third layer is a semiconductor characterized by relatively long mean free path and relatively high breakdown voltage compared to said first layer and said second layer.

24. A cathode according to claim 23, wherein said first and third layers comprise doped GaAs material and said second layer comprises AlGaAs material.

25. A cathode according to claim 22, wherein the material of said first layer has a lower band gap than that of the material of said third layer.

26. A cathode according to claim 25, wherein the material of one of said second and third layers is doped and the material of the other layer of said second and third layers is undoped.

27. A cathode according to claim 25, including enhancement means operably associated with said emitter surface for adjusting the energy levels of said electrons with respect to the work function of said emitting surface so that said energy levels exceed said work function and said electrons are thereby emitted from said emitting surface.

28. A cathode according to claim 27, wherein said enhancement means includes bias means for applying a potential between said first layer and said emitting surface whereby to increase the energy levels of said electrons to approximately said potential.

29. A cathode according to claim 28, wherein said emitting surface is activated with a material effective to reduce the work function of said surface.

30. A ballistic injector cathode comprising:
an emitting surface for emitting electrons from said ballistic injector cathode, said emitting surface having a work function, and said electrons having energy levels;
a first layer of semiconductor material for generating said electrons and providing said electrons to said emitting surface:
a second layer of material adjacent said first layer for providing a planar doped injector as a potential barrier to said electrons with respect to the material of said first layer;
a third layer of material adjacent said second layer opposite said first layer, constituting means for receiving said electrons from said second layer and conducting said electrons ballistically within the cathode toward said emitting surface associated with said third layer; and
first and second ohmic contacts arranged for applying a potential across said third layers, to increase the energy levels of said electrons transmitting said barrier to above the work function of said emitting surface.

31. A cathode according to claim 30, wherein the material of said third layer is characterized by it relatively long mean free path and relatively high breakdown voltage compared to said first layer and said second layer.

32. A cathode according to claim 30, wherein said first layer has a larger band gap than that of said third layer.

33. A cathode according to claim 30, wherein one of said second and third layers comprises undoped material.

34. A cathode according to claim 33, wherein said first and third layers comprise doped GaAs material and said second layer comprises AlGaAs material.

35. The cathode of claim 1 wherein said emitting surface further comprises a thin p-n junction forming a depletion region to reduce said work function.

36. The cathode of claim 1 wherein said emitting surface is further comprised of a negative electron affinity surface.

37. The cathode of claim 36 wherein said negative electron affinity surface is comprised of a thin p-n junction forming a depletion region for reducing said work function.

38. The cathode of claim 1 wherein said cathode is immersed a magnetic field for eliminating electron collisions, and for further enhancing the ballistic condition of said electrons.

39. The cathode of claim 1 wherein said enhancement means includes an accelerator region between said ballistic electron injector and said emitting surface for increasing the energy of said electrons.

40. The cathode of claim 39 wherein said accelerator region is comprised of a semiconductor of length shorter than the mean-free path for said electrons along said length of said semiconductor.

41. The cathode of claim 40 wherein said semiconductor is comprised of a first material from the group consisting of elements having 3 valence electrons and a second material from the group consisting of elements having 5 valence electrons.

42. The cathode of claim 40 wherein said semiconductor is comprised of indium antimonide (InAt).

43. The cathode of claim 1 wherein said ballistic electron injector includes a potential barrier comprised of a planar doped injector.

44. A ballistic electron solid state cathode comprising:
an emitting surface for emitting electrons, said emitting surface having a work function, and said electrons having energy levels associated therewith;
a ballistic electron rejector for providing said electrons to said emitting surface;
a potential barrier positioned between said ballistic electron injector and said emitting surface for increasing said energy levels of said electrons; and
enhancement means operably associated with said emitting surface for adjusting said energy levels of said electrons travelling ballistically within said cathode toward said emitting surface with respect to said work function of said emitting surface so that said energy levels exceed said work function and said electrons are thereby emitted from said emitting surface.

45. The cathode of claim 44 further comprising voltage control means associated with said potential barrier for controlling beam current density of said electrons emitted.

46. The cathode of claim 44 further comprising means for modulating a voltage applied to said potential barrier during operation of said cathode to control beam current density.

47. The cathode of claim 46 further comprising:
means for modulation of energy levels of said electrons;
means for modulation of said beam current density; and
means for independent control of said modulation of beam current density and said modulation of said energy levels of said electrons.

48. The cathode of claim 44 wherein said enhancement means includes:
an accelerator region having a length, said accelerator region being formed of solid state semiconductor material having a mean-free path longer than said length for increasing the energy levels of said electrons traveling ballistically along said length towards said emitting surface; and
means for varying said potential barrier m minimize the length of said accelerator region.

49. The cathode of claim 48 wherein said accelerator region is further comprised of:
a single layer having a length of approximately 1200 angstroms.

50. The cathode of claim 44 wherein said enhancement means includes:
an accelerator region for increasing the energy levels of said electrons travelling ballistically toward said emitting surface; and wherein
said emitting surface is of identical composition to the material of said accelerator region doped to reduce the work function at said emitting surface.

51. The cathode of claim 44 wherein said potential barrier is further comprised of a thin layer of beryllium atoms.

52. The cathode of claim 5 further comprising a shadow grid spaced apart from said metallic grid at a location away from said emitting surface for blocking interception of electrons by said metallic grid on said emitting surface.

53. The cathode of claim 1 wherein said emitting surface is comprised of a material selected from the group consisting of cobalt and nickel.

54. A ballistic electron solid state cathode comprising:
an emitting surface for emitting electrons, said emitting surface having a work function and a current density of said electrons, and said electrons having energy levels associated therewith;
a ballistic electron injector for injecting said electrons ballistically toward said emitting surface;
a potential barrier proximate said ballistic electron injector for increasing said energy levels of said electrons;
a solid state semiconductor for receiving and conducting said electrons ballistically to said emitting surface;
means for accelerating said electrons ballistically through said solid state semiconductor toward said emitting surface;
means to modulate said energy levels of said electrons with respect to said work function of said emitting surface so that said energy levels exceed said work function and said electrons are thereby emitted from said emitting surface; and
means for modulating said current density of said electrons, said means for modulating said current density being operably associated with said potential barrier.

55. The cathode of claim 1 wherein said ballistic electron injector is a semiconductor comprised of a majority carrier.

* * * * *